United States Patent [19]

Cohen et al.

[11] 4,174,540

[45] Nov. 13, 1979

[54] BUBBLE DOMAIN TRANSFER SWITCHES

[75] Inventors: Mitchell S. Cohen, Ossining; Emerson W. Pugh, Mt. Kisco, both of N.Y.

[73] Assignee: International Business Machines Corporation, Armonk, N.Y.

[21] Appl. No.: 811,734

[22] Filed: Jun. 30, 1977

[51] Int. Cl.$^2$ ............................................... G11C 19/08
[52] U.S. Cl. ........................................ 365/15; 365/24; 365/30; 365/39
[58] Field of Search ................... 365/13, 14, 15, 16, 365/24, 30

[56] References Cited

U.S. PATENT DOCUMENTS 4,070,658  1/1978  Giess et al. .............................. 365/36

OTHER PUBLICATIONS

IBM Technical Disclosure Bulletin – vol. 17, No. 5, Oct. 1974, p. 1535.
IEEE Transactions on Magnetics – vol. Mag-9, No. 3, Sep. 1973, pp. 481–484.

*Primary Examiner*—James W. Moffitt
*Attorney, Agent, or Firm*—Jackson E. Stanland

[57] ABSTRACT

These improved current controlled transfer switches are particularly useful for changing the propagation path of very small bubble domains without requiring large amounts of transfer current. The underlying principle is that the transfer operation occurs when the magnitude of the magnetic drive field used to move bubble domains has diminished to a small value, or is zero. This means that the magnetic field due to current in the switch does not have to overcome the effect of the drive field and therefore can be very small while still being effective. This is termed a "start/stop" operation and in one embodiment, current-assisted transfer is achieved by utilizing a change in the sequence of the magnetic drive field (generally an in-plane rotating field) at the time of transfer. In another embodiment, a continuous "three-quadrant" magnetic drive field is used instead of the customary 360° rotating drive field. This three-quadrant field cycle is also the normal cycle for bubble storage operations and bubble motion elsewhere in the magnetic circuit is not disturbed by the switching operation because all devices are designed to operate with only one type of drive field cycle, which is the three-quadrant cycle. Switches operating in accordance with these principles do not have to have a particular design; in fact, several different designs are illustrated.

23 Claims, 21 Drawing Figures

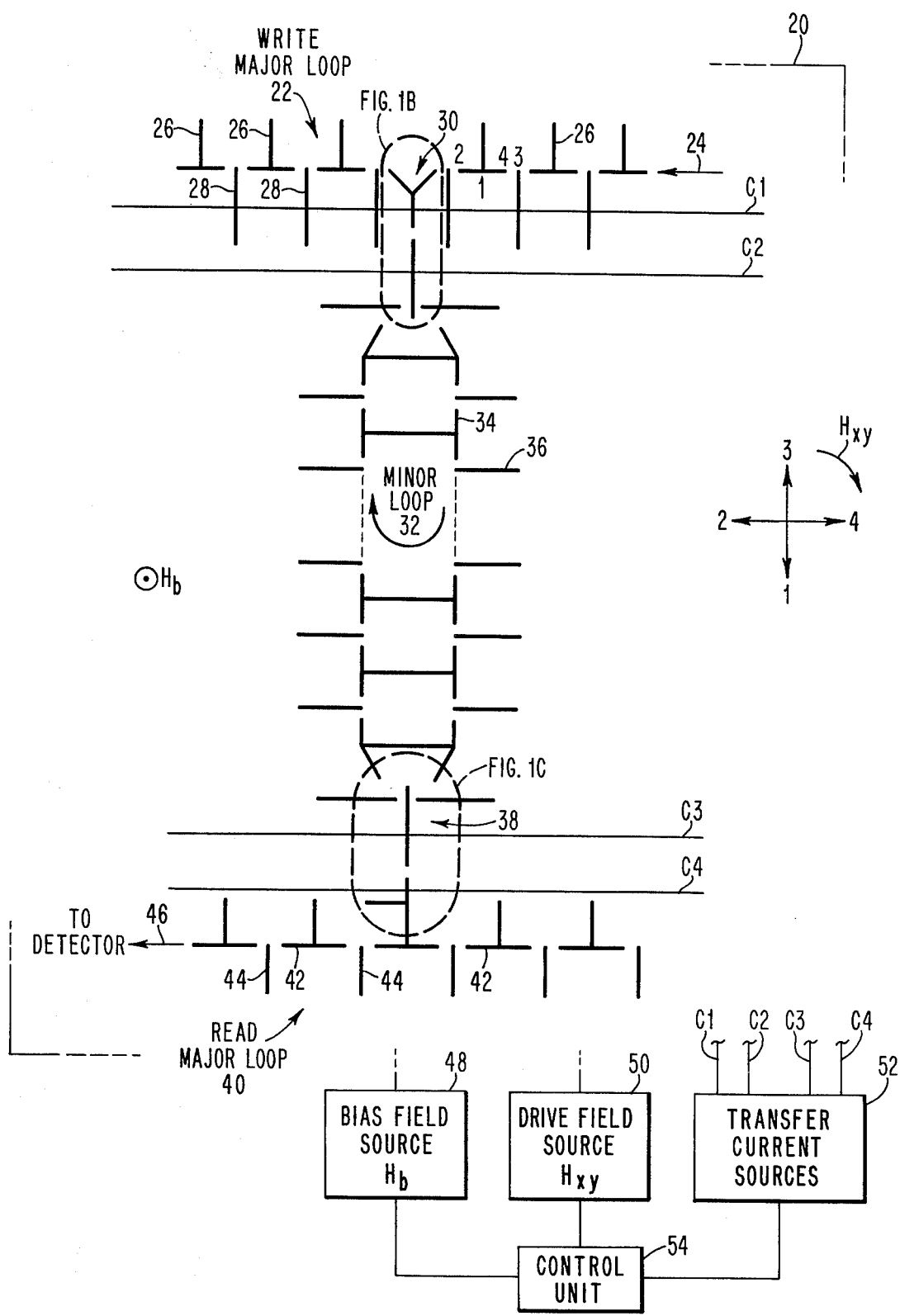

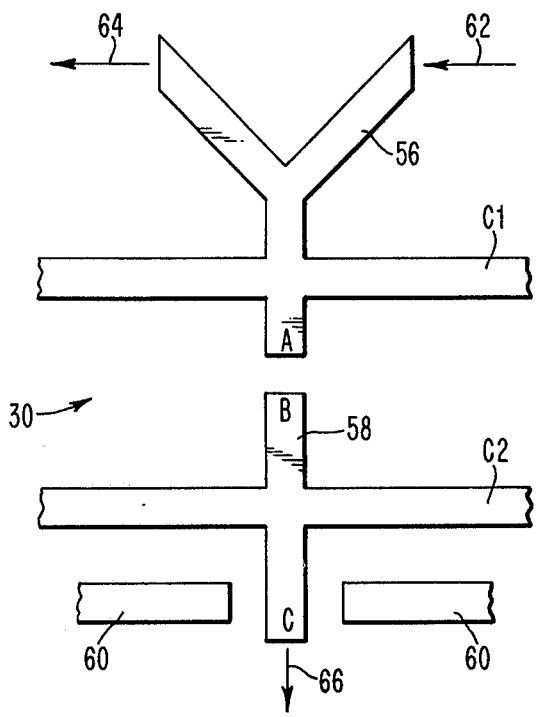
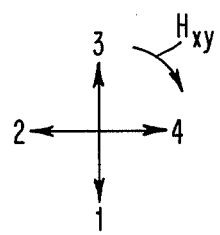
FIG. 1B
PRIOR ART
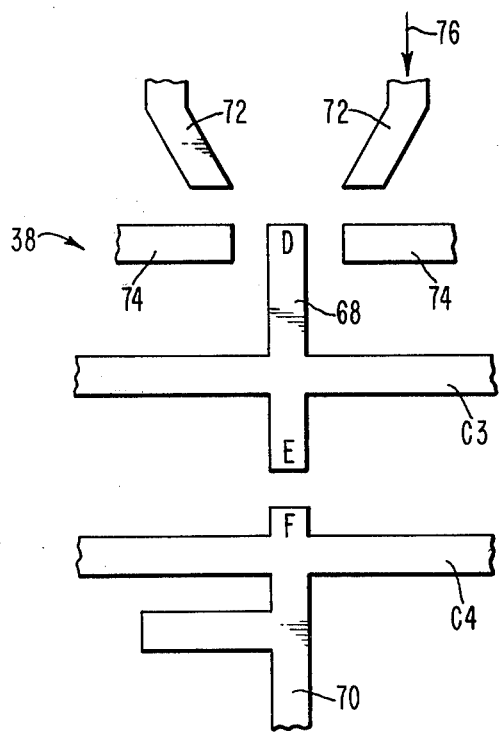
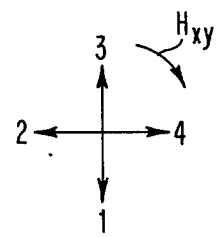
FIG. 1C
PRIOR ART

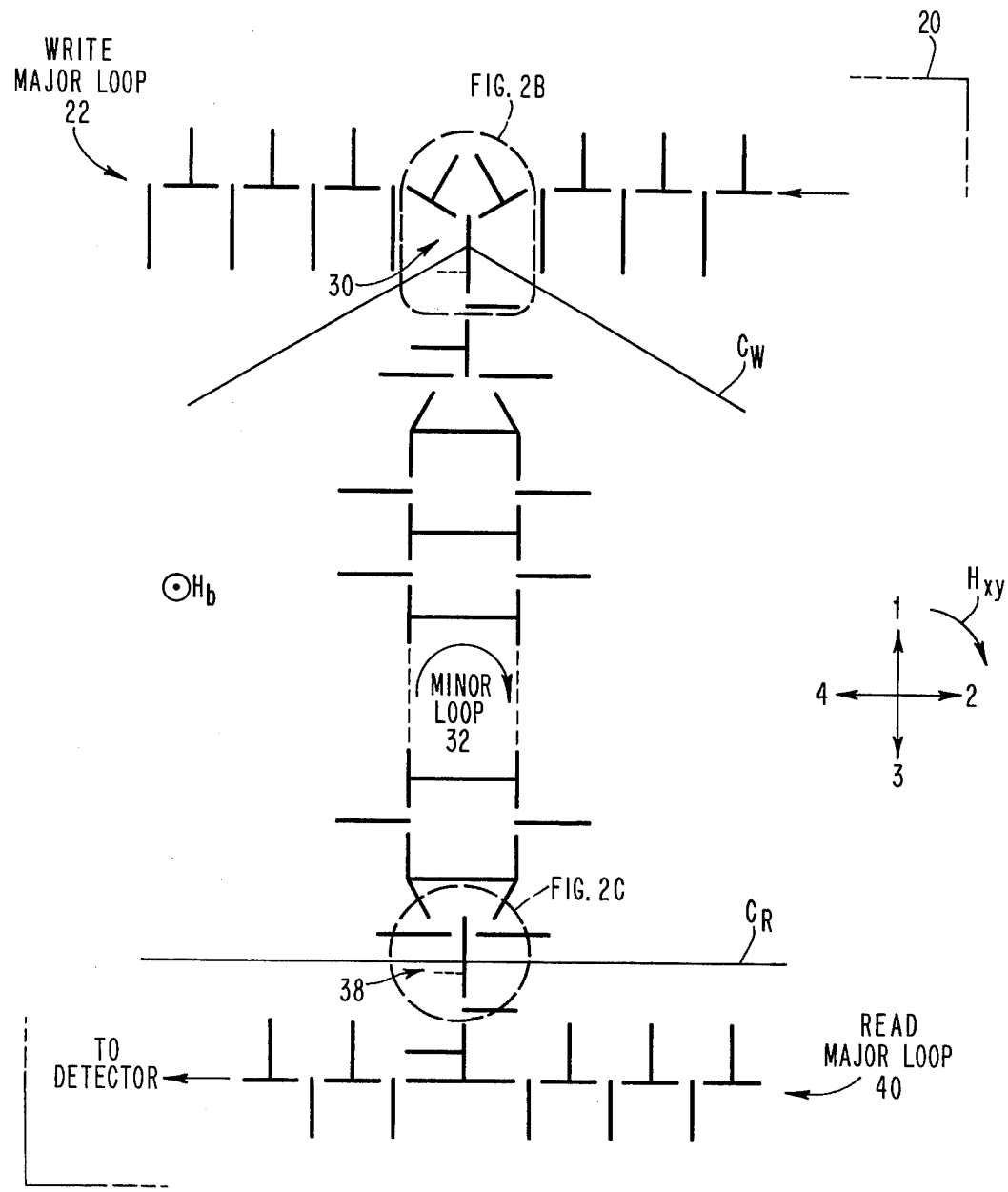

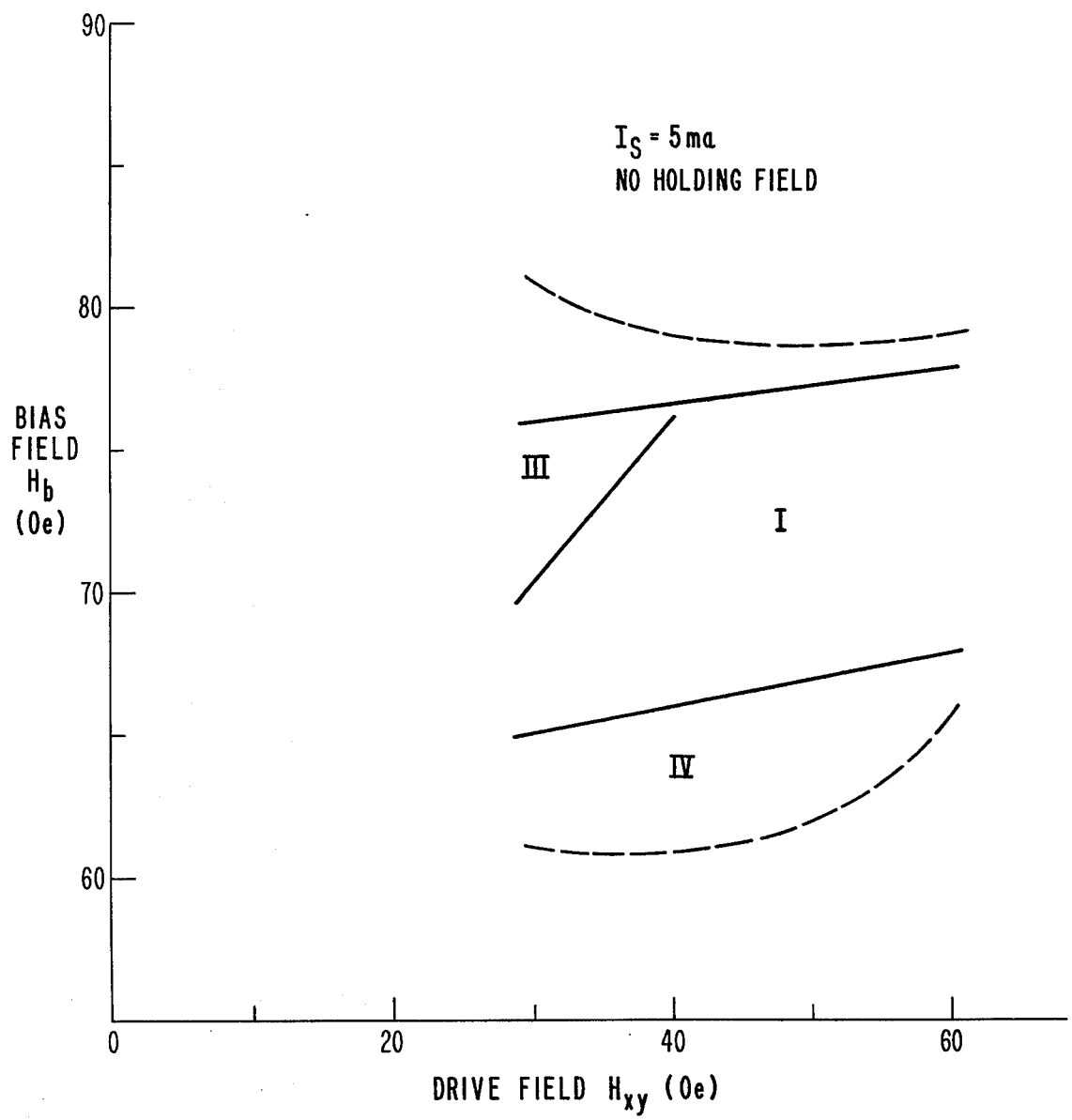

BUBBLE DOMAIN TRANSFER SWITCHES

BACKGROUND OF THE INVENTION

1. Field of the Invention

This invention relates to improved current controlled transfer switches for magnetic bubble domains, and more particularly to such transfer switches in which the magnitude of the transfer current is substantially reduced over that of conventional transfer switches.

2. Description of the Prior Art

In magnetic bubble domain storage systems, transfer switches are often required. These switches are used to change the normal propagation path of a bubble domain so that it will move into a new propagation path under the control of an input supplied to the switch. This input is a magnetic field which can be supplied, by, for instance, another bubble domain, a current pulse, or the stray magnetic field of a magnetic element. Common transfer switches utilize switching currents to achieve the transfer operation and either apply a current pulse to retain the bubble domain in its normal propagation path (such switches may be termed "drive-to-retain" switches) or apply a current pulse to effect the transfer operation in order to send a bubble domain to a new propagation path (these switches may be called "drive-to-transfer" switches).

The major difficulty in achieving operation of very high density magnetic bubble devices using current controlled transfer switches lies in providing adequate switching current for moving very small bubble domains. Generally, as the size of the bubble domain decreases, the magnetization $4\pi M$ of the bubble medium increases and the amount of the magnetic drive field $H_{xy}$ required to propagate bubbles also increases. Scaling laws indicate that as the bubble diameter decreases, the required switch current for a given transfer switch design remains substantially constant. However, as the bubble domain diameter becomes smaller, the minimum linewidths on the structural features of the switch also decrease. Since the required switch current remains substantially constant, the current density required for switching becomes very high as the bubble diameter and hence the structural features on the magnetic chip are scaled downward. This in turn becomes a problem due to electromigration effects where high current densities adversely affect the properties of the current carrying conductors.

In order to avoid this problem, switches operating on principles other than current control have been devised. For example, switching action can be achieved by a proper sequencing of the rotating magnetic drive field used for propagating bubble domains. This is shown in, for instance, W. F. Beausoleil et al, IBM Technical Disclosure Bulletin, Volume 15, No. 7, December 1972, p.2093, as well as in U.S. Pat. Nos. 3,613,058 and 3,543,252. While this appears to be an ideal solution since no transfer current is required, considerable effort is required to develop appropriate geometries for the transfer switch elements and for the bubble propagation elements in the chip in order to provide acceptable operating margins. Furthermore, the fact that all switches in a given bubble domain module will necessarily see the same drive field sequence places substantial constraints on the design of the chips as well as on the entire system.

Another approach to providing bubble path selection by varying the magnetic drive field is illustrated in U.S. Pat. Nos. 3,530,446 and 3,541,535. In these patents, the amplitude of the rotating drive field is changed in order to change the direction of bubble propagation or to select the channel in which propagation occurs. These approaches are not as desirable, however, since they often require either a change in the geometry of the elements in order to provide the desired propagation directions, or variations in the material properties of the propagation elements used to move the bubble domains. This in turn requires additional fabrication steps and the use of at least two materials having different magnetic properties.

Current controlled transfer switches appear to be the type of transfer switches which have been most extensively developed by the industry. These include both the "replicate" type of switch in which a bubble domain is split into two parts to enable retention of the stored information, and the conventional type of transfer switch in which the stored bubble domain is not split. Many of these switches have been designed to be fabricated entirely of a single material in order to enable a single masking step fabrication process. This single level metallurgy (SLM) is a desirable feature, especially when very small magnetic bubble domains (of 1 micron diameter and less) are to be used. In particular, U.S. Pat. No. 3,984,823 describes a replicate-type transfer switch in which a sequence of current pulses is applied to stretch a domain and then cut it to effect replicate/transfer operation. This switch includes means for maintaining the magnetic drive field orientation in a fixed direction during the stretching and replicate operation. This is considered to provide advantages since it permits a stop-start operation in which detection can occur in the absence of a magnetic drive field reorientation, which in turn benefits signal-to-noise ratio and logic-circuit design. If the drive field is terminated altogether during the stretch-replicate operation, a separate magnetic field of fixed orientation is applied.

While U.S. Pat. No. 3,984,823 describes a transfer switch in which a control current is used in combination with a modification of the magnetic drive field during the transfer operation, it is not directed to a switch which requires only small amounts of transfer current. In the switch of that patent, the magnitude of the drive field remains constant and its orientation is fixed during the transfer operation. While this provides greater tolerances in phasing, it does not reduce the required currents for a switch using very small magnetic bubble domains.

Accordingly, it is a primary object of the present invention to provide an improved magnetic bubble domain transfer switch which requires small amounts of transfer current.

It is another object of this invention to provide a magnetic bubble domain transfer switch which can be scaled down to transfer micron and submicron bubble domains without requiring adversely high currents.

It is another object of the present invention to provide a technique for operating magnetic bubble domain transfer switches of any design in a mode which requires minimal transfer current amplitudes.

It is a further object of the present invention to provide magnetic bubble domain transfer switches which can be fabricated by single level metallurgy techniques and which require minimal transfer current amplitudes.

It is a further object of the present invention to provide magnetic bubble domain chips using minimal current amplitudes for transfer switches with drive field sequences which do not adversely affect margins of other devices in the bubble chip.

It is a still further object of the present invention to provide improved current-controlled SLM bubble domain switches where problems due to magnetization reversal are minimized.

It is a further object of the present invention to provide an improved magnetic bubble domain chip using a non-conventional applied drive field cycle which is continuous.

It is another object of the present invention to provide a magnetic bubble domain chip using a magnetic drive field cycle which aids in the design of bubble sensors so that noise signals can be minimized.

It is a further object of the present invention to provide improved operation of magnetic bubble domain devices by techniques which can be applied to many different switch and propagation element designs.

BRIEF SUMMARY OF THE INVENTION

This invention particularly relates to current controlled transfer switches, and techniques for reducing the amount of current required for controlling the propagation path of bubble domains through the switch. These techniques are particularly applicable to the design of very small diameter bubble devices, where the problem of electromigration due to high current densities is particularly severe.

Prior art transfer switches which are activated only by current require unacceptably high current densities for very small bubble devices. On the other hand, drive-field controlled transfer switches tend to have narrow margins and also limit chip design flexibility since all switches see the same magnetic field drive sequences and since other devices on the magnetic chip also see the same drive field sequences. Accordingly, the present invention utilizes changes in the drive field sequence together with current control to provide an improved technique for switching the path of bubble domains. In particular, bubble domain path selection is made when the magnitude of the magnetic drive field is decreasing or has a very small value (preferably zero) so that the current levels do not have to be large in order to overcome the effects of the drive field. Furthermore, these techniques illustrate how a complete magnetic chip can be designed to have low current transfer switches while at the same time not adversely affecting margins of other devices on the magnetic chip.

In one embodiment, the transfer path is determined by a current pulse and by changing of the directional sequence of the rotating drive field normally used to propagate magnetic bubble domains at the time of transfer (path selection). At other times, the drive field sequence is not changed and is usually a continuous 360° rotating cycle. Also, in many switch designs the choice of bubble path to be followed is made when bubbles are on magnetic elements, and not when the bubble is located between two magnetic elements. This further reduces the amount of current needed in those switches. Another advantage is that the failure mechanism associated with many types of single level masking switches, namely premature strip-out and collapse of a bubble at the conductor because of magnetization-reversal effects, is suppressed during the start-stop operation achieved by this drive field sequence.

In another embodiment, low current transfer switches operate with a magnetic drive field which follows a continuous three-quadrant field cycle. In such a field cycle, the drive field rotates with a constant magnitude through approximately 270°, then diminishes to a lower amplitude, and starts up again at its initial amplitude 90° later. The transfer current pulse is applied while the amplitude of the drive field is diminishing or when it has a low amplitude. Variations of the drive field can be utilized, such as sinusoidal drives or triangular drives. All devices on the same magnetic chip, including transfer elements, propagation elements, generator elements, and detector elements operate with the same "three-quadrant" drive field cycle which is termed a "continuous" field cycle, since it is always the same. Various drive field cycles using drive fields having different amplitudes at different portions of the cycle are shown in U.S. Pat. No. 3,952,292. These cycles are not used to provide more efficient current-assisted transfer switches, however.

This altered drive field cycle is more convenient for a switch operation than is the drive field cycle used in the first embodiment, since it is now a normal drive cycle for all functions in a complete bubble domain memory. Thus, all devices can be designed with only one type of drive field cycle. As an additional advantage, this type of transfer switch can be used to control the data pattern from a replicate-type bubble generator. Still further, the use of a three-quadrant drive field cycle means that the bubble detector can be arranged so that the sense signal is strobed only during the "stopped" portion of the drive field cycle (when the amplitude is diminishing) when the magnetic domains in the sensor should be quiescent. This will eliminate noise pickup in magnetoresistive bubble detectors in the absence of a bubble. This noise pickup is a common problem since the drive field causes Barkhausen noise signals originating in magnetization reversal.

The drive field cycle can be modified in several ways. The use of a holding field during the time when the drive field is minimized can be used to facilitate the retention of information when the drive field is off if this is required. This will lead to some increase in transfer switching current but the amount of current required will still be much smaller than is customarily used.

This technique can be applied to transfer switches fabricated by single level metallurgy in which only one masking step is used, or to transfer switches comprising multiple levels of metallurgy. In SLM switches, the control conductor and the magnetic elements defining the bubble propagation paths are comprised of the same material, while in multiple level switches the transfer control conductor is comprised of a material different than that used to provide the magnetic propagation elements. The techniques of the present invention are applicable with many different types of switches, several of which will be illustrated.

These and other objects, features and advantages will be more apparent from the following more particular description of the preferred embodiments.

BRIEF DESCRIPTION OF THE DRAWINGS

FIG. 1A is a circuit diagram for a major/minor loop bubble domain memory using transfer switches operating in a start-stop mode where the drive field sequence is changed during the transfer operation.

FIGS. 1B and 1C show portions of the circuit of FIG. 1A, and are used to explain the operation of the switches in FIG. 1A.

FIG. 2A is a circuit diagram of a major/minor loop bubble domain memory in which the write transfer switch (FIG. 2B) and the read transfer switch (FIG. 2C) are different than the write and read transfer switches in the circuit of FIG. 1A.

FIGS. 4A and 4B are margin plots for the switch of FIG. 3A, operated in a start-stop mode.

FIGS. 5A and 5B illustrate one type of sinusoidal drive, while FIGS. 6A and 6B illustrate another type of sinusoidal drive. FIG. 7 illustrates a sinusoidal drive together with a holding field, while FIG. 8 illustrates a triangular drive field.

DETAILED DESCRIPTION OF THE PREFERRED EMBODIMENTS

FIELD SEQUENCE CHANGE DURING SWITCHING

FIGS. 1A, 1B, and 1C

Figure 2B:
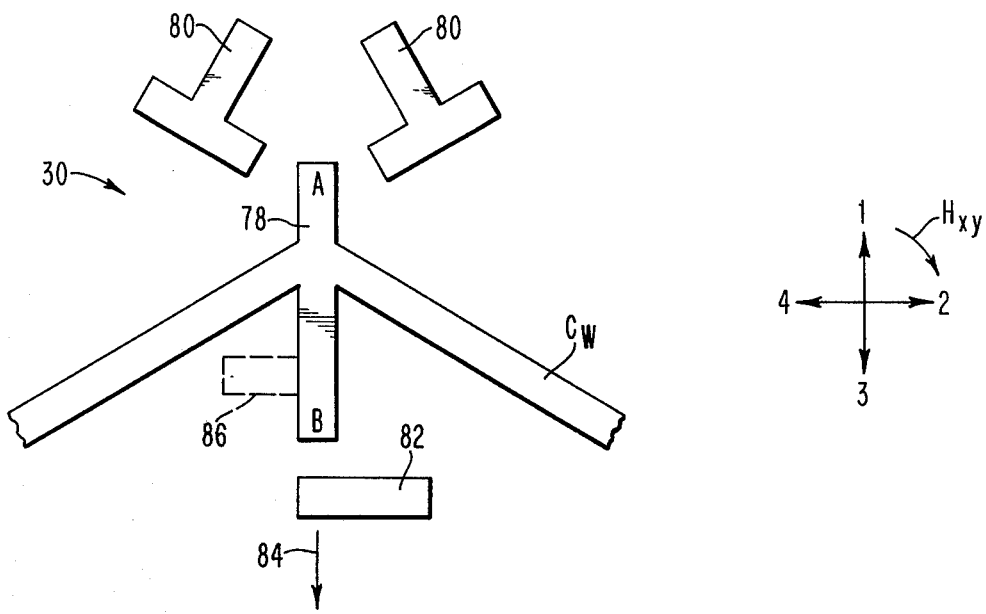
FIGS. 2B and 2C are used to illustrate the operation of the transfer switches of FIG. 2A in a start-stop mode of operation where the sequence of drive field $H_{xy}$ is changed during the transfer operation.

FIG. 1A illustrates a portion of a major/minor loop bubble domain memory such as that known in the prior art. The circuitry shown in this figure is located adjacent to a magnetic bubble domain material 20 which can be any material capable of supporting magnetic bubble domains therein. This bubble domain memory is comprised of a write major loop 22 along which magnetic bubble domains move in the direction of arrow 24 as field $H_{xy}$ reorients in the plane of medium 20. In this illustration, write major loop 22 is comprised of T-bars 26 and I-bars 28. A read transfer gate 30 includes the components shown in the dashed lines, and is used to selectively transfer bubble domains from the write major loop 22 to the minor loop 32 for storage therein.

Minor loop 32 is also comprised of T-bars 34 and I-bars 36, in this illustration.

At the other end of the minor loop 32 a read transfer gate 38, shown in dashed lines, is used to selectively transfer magnetic bubble domains from the minor loop 32 to a read major loop 40. Read major loop 40 is typically comprised of T-bars 42 and I-bars 44. As field $H_{xy}$ reorients, bubble domains in loop 40 move to a detector (not shown) along the direction of arrow 46.

A magnetic bias field $H_b$ is produced by the bias field source 48, and is used to stabilize the size of bubble domains in material 20. A drive field source 50 is used to produce the in-plane drive field $H_{xy}$. Drive field source 50 is typically comprised of current carrying coils located around the magnetic bubble domain chip and arranged in quadrature so that various combinations of current in the coils will produce the desired type of drive field.

Transfer current sources 52 are used to provide control current inputs to conductors in the write transfer gate 30 and the read transfer gate 36. Field sources 48 and 50, as well as transfer current sources 52, operate in synchronism due to inputs from control unit 54. Unit 54 provides the clocking and trigger pulse inputs to the various components of the overall bubble domain memory, in order to synchronize the operation of different components in the memory.

FIG. 1B shows the write transfer gate 30. This transfer gate is comprised of the Y-bar 56, conductor C1, I-bar 58, and conductor C2. Located on opposite sides of I-bar 58 are the I-bars 60. In this FIG., a SLM switch is shown, since the conductors C1 and C2 are comprised of the same material as the Y-bar 56 and the I-bar 58. Typically, magnetically permeable materials, such as NiFe, are used.

The operation of the write transfer gate 30 when transfer is desired is as follows. A bubble domain will be at position A at the base of Y-bar 56 when field $H_{xy}$ is in direction 1. Field $H_{xy}$ is now stopped and reduced in amplitude, and the direction of $H_{xy}$ is changed in the sequence 1-3-1, without rotation of this field. When $H_{xy}$ is in direction 3, the bubble moves to position B at the top of I-bar 58. An appropriate current in conductors C1 and C2 can be applied to aid this transition. At the subsequent reversal of field $H_{xy}$ back to direction 1, the bubble has a choice of going either to position C at the bottom of I-bar 58, or back to position A on Y-bar 56. The choice can be determined by appropriately pulsing current lines C1 and C2. If, as a result of this 1-3-1 sequence the bubble is left at position A, when the field $H_{xy}$ is again started in the usual rotation 1-2-3-4-1-, the bubble continues propagating in the write major loop 26. That is, bubble domains will enter write transfer switch 30 along the direction of arrow 62 and will exit from this switch along the direction of arrow 64.

On the other hand, if the bubble is left at position C at the bottom of I-bar 58 as a result of the 1-3-1 sequence, the bubble will move to the minor loop 32 in the direction of arrow 66. This will effect the transfer operation.

Readout of the minor loop into the read major loop 40 is accomplished in a similar fashion, but with the use of the pulse sequence 3-1-3. This operation is illustrated in FIG. 1C, which shows the read transfer switch 38. Switch 38 is comprised of the I-bar 68, T-bar 70, and conductors C3 and C4. Portions of elements 72 in the minor loop are also shown in this drawing, as are portions of the I-bars 74. In response to the rotation of field $H_{xy}$, bubble domains travel in minor loop 32 in the direction of arrow 76. When $H_{xy}$ is in direction 3, a bubble domain will be at position D at the top of I-bar 68. When $H_{xy}$ is reduced to zero then reversed to direction 1, this bubble will move to position E at the base of I-bar 68. Appropriately directed current in conductors C3 and C4 can be applied to aid this transition. At the subsequent reversal of field $H_{xy}$ back to phase 3, the bubble can either move back to position D or onto position F on T-bar 70. When field $H_{xy}$ starts its rotation again (3-4-1-2-3-), the former choice will have kept the bubble in the minor loop 32, while the latter choice will have effected readout of the bubble to the read major loop 40.

The write and read operations do not affect each other because when a bubble is at position A (FIG. 1B), no bubble can be at position D (FIG. 1C), and vice versa. On the other hand, bubbles on all other propagation elements must be able to withstand the 3-1-3 and 1-3-1 transitions without substantial loss of operating margins. Laboratory tests have established that bubbles can indeed move between two colinear I-bars over a bias field range. Thus, this type of start-stop operation can be performed successfully in a memory chip.

It should be noted that the transfer switch currents were applied at times when the rotating field $H_{xy}$ is stopped and diminished in amplitude. For example, the 1-3-1 transition means that $H_x$ stays at a zero value while $H_y$ diminishes to zero and then increases to an equal negative value. Thus, if transfer current is applied during this transition, the amount of current required will be reduced, since the amplitude of the drive field $\vec{H}_{xy} = \vec{H}_x + \vec{H}_y$ is reduced at the time the current pulse is applied.

Figure 2C:
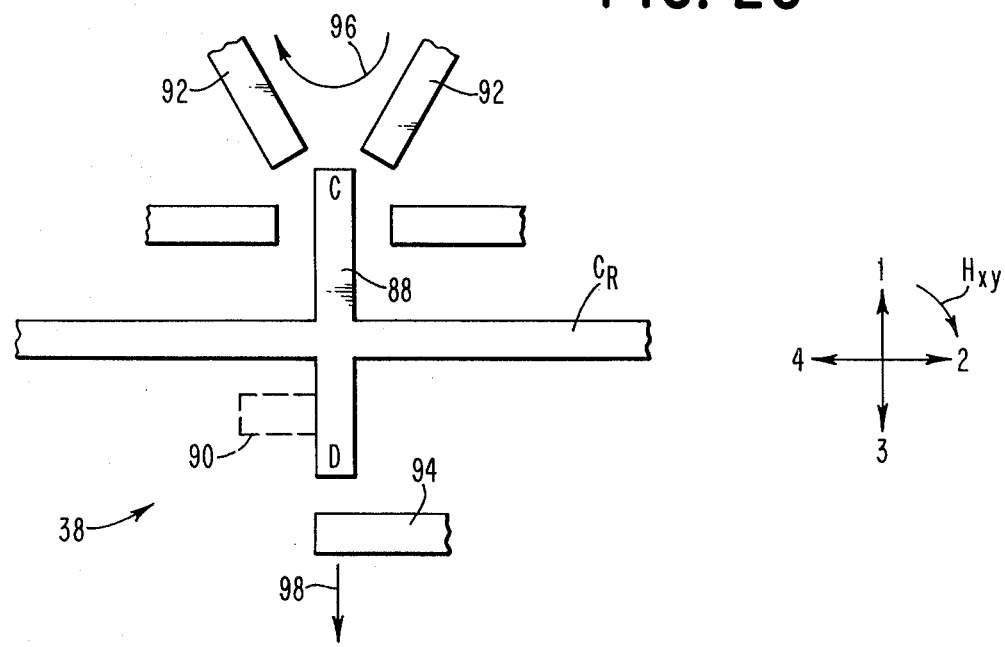

FIGS. 2A, 2B, and 2C illustrate other switch embodiments which also utilize a change in drive field sequence when transfer is desired together with transfer currents, to effect transfer operations at very small current levels. Since the memory organization of the circuit of FIG. 2A is the same as that of the circuit of FIG. 1A, the same reference numerals will be used to identify the same functional components. Accordingly, FIG. 2A shows a write major loop 22, a storage minor loop 32, and a read major loop 40. Write transfer gate 30 (within the dashed lines) is used to transfer bubble domains from the write major loop 22 to the minor loop 32. Correspondingly, read transfer gate 38 within the dashed lines is used to selectively remove bubble domains from minor loop 32 for propagation in read major loop 40. These various devices in the memory of FIG. 2A operate in response to reorientation of the magnetic drive field $H_{xy}$. For the usual operations, this is a continuously rotating field which moves through 360° in a constant direction. However, as will be seen with respect to FIGS. 2B and 2C, the sequence of the field $H_{xy}$ is altered during transfer operations, when transfer currents are applied in the write conductor $C_W$ and the read conductor $C_R$.

The various magnetic field sources and current sources shown in FIG. 1A are not shown here for ease of illustration.

In FIG. 2B, write transfer gate 30 is comprised of the I-bar 78 having a write conductor $C_W$ crossing it. I-bar 78 and conductor $C_W$ can be comprised of the same materials if an SLM switch is desired. Also shown here are magnetic elements 80 which form a portion of minor loop 32, and I-bar 82, which is used as part of the propagation path bringing bubble domains to read major loop 40.

When field $H_{xy}$ is in direction 1, a bubble domain will be at position A at the top of magnetic element 78. If it is desired to prevent transfer of the bubble domain into the minor loop, rotation of field $H_{xy}$ is continued and the bubble will propagate to the left to the T-bar 80. If, on the other hand, transfer into the minor loop 32 is desired, field $H_{xy}$ is stopped at phase 1, and reduced to zero. A small holding field of a few oersteds can be applied in direction 1 in order to improve the margins of the transfer switch, if this is desired. However, such holding field is not absolutely necessary. A current can then be applied in conductor $C_W$ in the appropriate direction in order to move the bubble domain at position A on bar 78 to position B at the bottom of this bar.

After this, the rotating field $H_{xy}$ is then restarted, not at direction 1, but rather in direction 2. The bubble domain at position B will then move vertically downward in the direction of arrow 84, to the minor loop 32. The current in conductor CW can then be removed.

Bubble domains in other positions in the memory will continue to propagate normally after subjection to this start-stop operation, but a bubble domain will have been successfully transferred into the minor loop during this field sequence change.

The dashed line 86 on transfer I-bar 78 represents an additional bar which can be added to element 78 in order to aid maintenance of wide margins during the restart of the rotating field $H_{xy}$ at phase 2. Bar 86 is not absolutely essential to the transfer switch, however.

FIG. 2C shows the transfer read-out switch 38. This switch is primarily comprised of the I-bar 88 which has a readout conductor $C_R$ crossing it. As with write transfer switch 30, a bar 90, shown in dashed lines, can be added to help maintain wide margins during the readout transfer. Magnetic elements 92 are portions of the minor loop 32, while I-bar 94 is a part of the propagation path which brings bubble domains removed from the minor loop 32 to the read major loop 40. Thus, bubble domains usually propagate in minor loop 32 in the direction of arrow 96. Only when they are to be transferred to the read major loop 40 do they travel along the direction indicated by arrow 98.

For read-out, consider a bubble domain at position C at the top of I-bar 88 when field $H_{xy}$ is in direction 1. If it is desired to retain the bubble domain in the minor loop, field $H_{xy}$ continues to rotate to directions 2-3-4-. If it is desired to transfer the bubble domain to the read major loop 40, field $H_{xy}$ is turned off when it is in direction 1. A current in conductor $C_R$ of the appropriate polarity is used to transfer the bubble down from position C to position D at the bottom of I-bar 88. Rotating field $H_{xy}$ is then restarted in direction 2, and the bubble will continue to propagate downwardly, moving to I-bar 94 and then in the direction of arrow 98.

As will be apparent when the second embodiment (three-quadrant field cycle) is described, a continuous three-quadrant field cycle can be used instead of the usual 360° rotation and then the modified sequence when the field is turned off at 1 then back on at direction 2. The three-quadrant cycle can be used for both propagation and switching and is therefore "continuous". Since the field change here is off at 1, then on again at 2, it is essentially a three-quadrant cycle.

FIGS. 3A, 3B, 4A and 4B

Figure 3A:
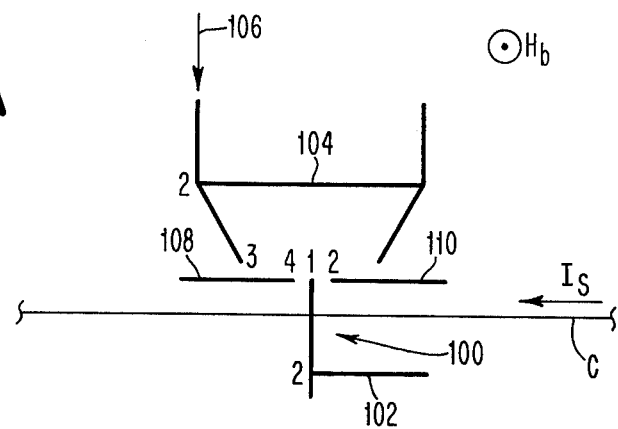
FIG. 3A is an illustration of a "T-bar toggle" switch which can be operated in a start-stop mode of operation using the drive field of FIG. 3B.

FIG. 3A illustrates another type of switch which operates in the mode described, i.e., a change in the sequence of the applied field at the same time current through the switch is applied to determine the path of the bubble domain through the switch.

In more detail, this switch is primarily comprised of a magnetic element 100 which has a bar segment 102 used to create a magnetic pole 2 at the end of bar 102 when field $H_{xy}$ (FIG. 3B) is in direction 2. Magnetic element 104 is used as a cornering element of a bubble domain minor loop, so that domains normally travel downward in the direction of arrow 106 to enter the switch. Magnetic I-bars 108 and 110 are also provided. Conductor C crosses a portion of magnetic element 100.

In operation, bubble domains move downwardly in the direction of arrow 106 toward magnetic element 100, as field $H_{xy}$ rotates. When $H_{xy}$ is in direction 1, the field is stopped and reduced to zero so that a bubble domain will be at pole position 1 at the top of element 100. If it is desired to transfer this bubble domain out of the minor loop, a current of appropriate direction is applied in conductor C. This switch current $I_S$ is applied during the time period indicated in FIG. 3B. Direction 1 is the critical direction for field $H_{xy}$, since for the following direction 2, the bubble domain can either go to pole position 2 on I-bar 110 or to pole position 2 at the left-hand end of bar 102. A small current $I_S$ in conductor C will tip the bubble into either one of pole positions 2 on elements 110 or 100.

If transfer out of the minor loop is desired, current $I_S$ is applied to move the bubble downward along element 100. Then, when field $H_{xy}$ is restarted in direction 2, the bubble domain will be at pole position 2 along element 100. Current $I_S$ is removed between field directions (phases) 2 and 2'. After this, field $H_{xy}$ continues its usual rotation 3-4-1-2, etc. for continued propagation of the bubble domains. Each time it is desired to transfer a bubble domain out of a minor loop, the same start-stop sequence of field $H_{xy}$ is used.

The length of magnetic bars 110 and 102 will determine whether the switch is drive-to-retain or drive-to-transfer. For example, if it is desired to have the switch be drive-to-transfer, then bubble domains should continue to propagate in the minor loop in the absence of current $I_S$. For drive-to-transfer, pole position 2 on bar 110 should be stronger than pole position 2 at the end of bar 102. One way to do this is to make bar 110 longer than bar 102.

If it is desired to have the switch be drive-to-retain, bubble domains would then normally follow the rotating field and exit from the minor loop as field $H_{xy}$ rotates. For this mode of operation, bar 102 is made longer than bar 110, in order to make pole 2 at bar 102 stronger than pole 2 at bar 110. For this design, current $I_S$ is required to retain bubbles in the minor loop.

Figure 4B:
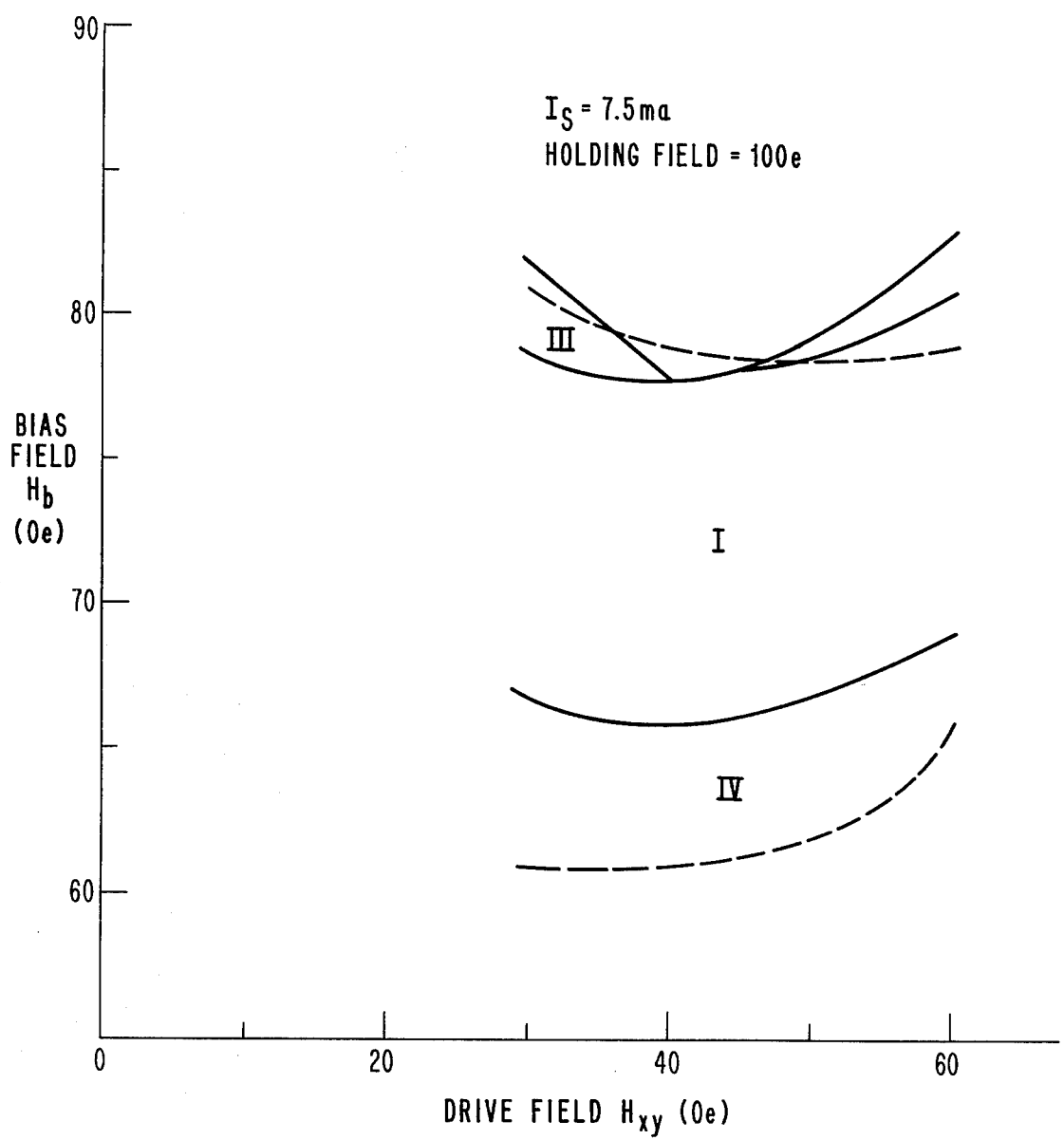

FIGS. 4A and 4B show quasistatic margin plots for the switch of FIG. 3A, for two different magnitudes of switch current $I_S$. In FIG. 4A, the current $I_S$ has a magnitude of 5 mA, and the bubble diameter is 5 microns. No holding field in direction 1 was used to obtain the data for this plot.

The margin plot shows the vertical bias field $H_b$ as a function of the drive field $H_{xy}$. The dashed lines indicate straight-track propagation using a 360° rotating field $H_{xy}$. The solid lines indicate switching margins in which the field sequence $H_{xy}$ is that shown in FIG. 3B.

Region I indicates the margins for successful switch operation, while region III indicates a region where the bubble remained in the minor loop despite the application of switch current. In region IV, there was strip-out and replication in the switch and therefore failure of switch operation.

Figure 3B:
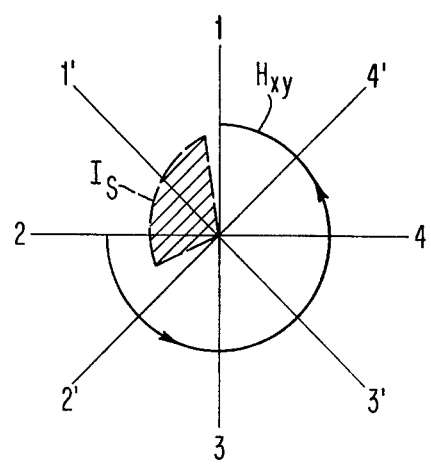

FIG. 4B shows a margin plot in which the transfer current is now 7.5 milliamps, in the presence of a dc holding field in direction 1. As with the margin plot of FIG. 4A, the dashed lines indicate straight-track propagation using a 360° rotating field drive $H_{xy}$. The straight lines indicate switch operation with a modified field sequence as shown in FIG. 3B. Thus, region I illustrates successful switch margins while again regions III and IV indicate failure regions for the transfer switch of FIG. 3A.

CONTINUOUS THREE-QUADRANT CYCLE OF DRIVE FIELD (FIGS. 5A–13)

This embodiment shows various switches used to transfer bubble domains from one propagation path to another, using a continuous drive field $H_{xy}$ which is substantially off (i.e., $H_{xy}$ has reduced amplitude) during one quadrant of the 360° drive field cycle. In contrast with the previously described field sequence where the drive field was stopped and then started at a later time in a different direction (such as the opposite direction) whenever switch action was desired, the three-quadrant drive field sequence is continuously applied in this embodiment. Thus, this three-quadrant cycle is now a normal cycle for memory operation. Bubble motion elsewhere in the magnetic circuit than in the transfer switch is not disturbed by the switching operation because all devices in the memory operate under application of the three-quadrant field cycle.

FIGS. 5A–8

Figure 5A:
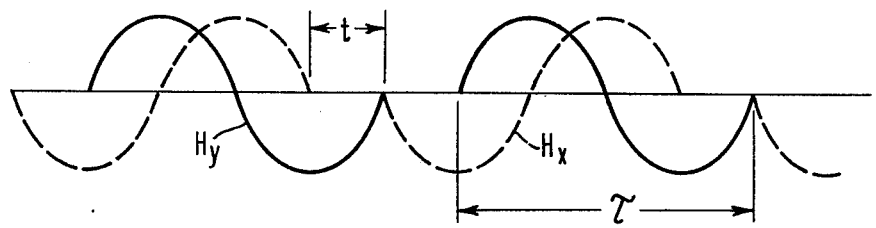
FIGS. 5A, 5B, 6A, 6B, 7 and 8 illustrate various three-quadrant waveforms for the drive field $H_{xy}$ which can be used for reducing the amount of current required in a current controlled transfer switch. Specifically.
Figure 5B:
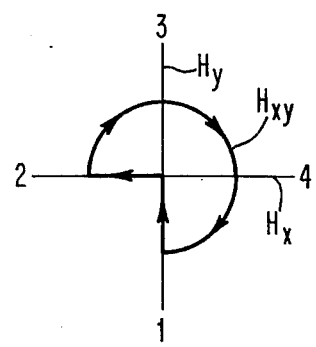

These figures illustrate various waveforms which can be used to provide the three-quadrant field cycle described for operation of both transfer switches and propagation elements. For example, FIG. 5A illustrates a sinusoidal drive field comprising sinusoidal components $H_x$ and $H_y$, while FIG. 5B is a Lissajous plot of the net field for the waveforms of FIG. 5A. Fields $H_x$ and $H_y$ are produced by sinusoidal current waveforms in X and Y drive coils, as is well known. For example, reference can be made to U.S. Pat. No. 3,952,292 which shows various drive field cycles and circuits for producing these cycles.

In FIG. 5A, sinusoidal drives $H_x$ and $H_y$ are out of phase with one another by the time t. In this FIG., $t = \tau/4$, where $\tau$ is the period of either $H_x$ or $H_y$. This is the shortest delay time possible if $H_{xy}$ of zero is to be achieved during application of a switch current. Thus, in FIG. 5B, field $H_{xy}$ rotates continuously through 270° as it proceeds from direction 2 to direction 1. It then diminishes to zero and starts again in direction 2. As will be seen, switch current $I_S$ can be applied between field directions 1 and 2 while $H_{xy}$ is zero. This will minimize the required switch current, since field $H_{xy}$ will not have to be overcome.

Figure 6A:
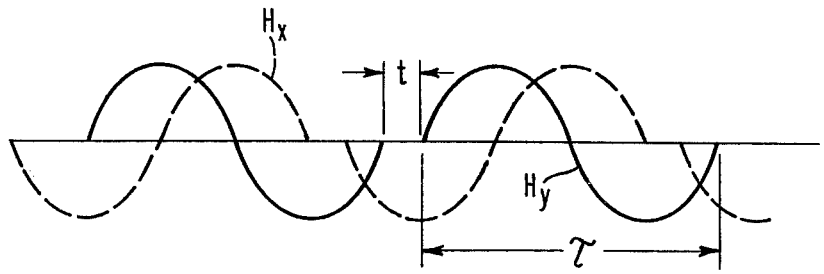
Figure 6B:
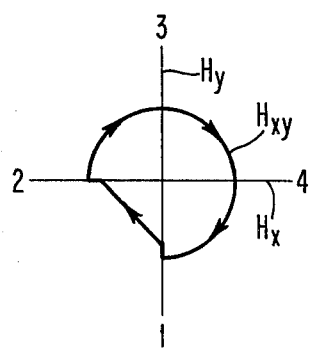

FIG. 6A illustrates the waveforms $H_x$ and $H_y$ where the delay time $t = \tau/8$. The Lissajous plot for these waveforms is shown in FIG. 6B, where it is apparent that field $H_{xy}$ does not go fully to zero in the quadrant between phases 1 and 2. This field cycle will result in a small (10%) increase in data rate, but will lose some of the advantages associated with delays of $t \geq \tau/4$, in which $H_{xy}$ reaches zero. That is, the amount of switching current required using the field cycle of FIGS. 6A and 6B will be greater than that required using the field cycle of FIGS. 5A and 5B, since $H_{xy}$ will not go to zero in the former case. Due to imperfect timing and actual risetime characteristics of practical drive circuitry used to provide field components $H_x$ and $H_y$, it is desirable to use field cycles with nomimal delays in excess of $\tau/4$.

Figure 7:
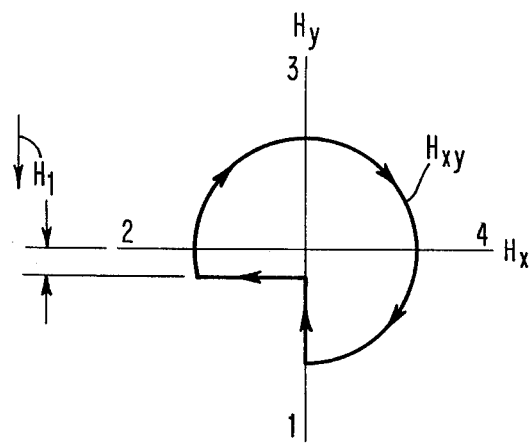

FIG. 7 illustrates a sinusoidal drive field $H_{xy}$ having delay $t = \tau/4$. However, a holding field $H_1$ is applied in direction 1. This is a dc field which facilitates the retention of information when the field $H_{xy}$ is off. Of course, some increase in switching current $I_S$ will be required in the start-stop switches described herein, since the net field $H_{xy}+H_1$ will not be zero during the transfer operation.

If holding field $H_1$ is used for non-volatility during long shutdowns of the circuit, improved margins can result with a coil-supplied dc field in the opposite direction (direction 3) during rotation of field $H_{xy}$ between phases 2-3-4-1. This will result in improved margins for bubble propagation and improved data rates over the situation where field $H_1$ is applied in addition to drive field $H_{xy}$.

Figure 8:
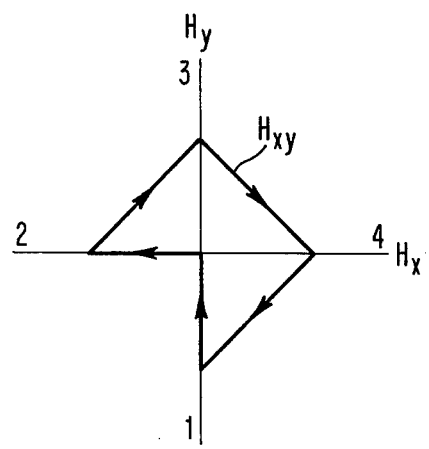

Sinusoidal drive fields are not an essential element of this embodiment. For example, triangular shaped current pulses can be provided in the X and Y drive coils to provide a triangular drive field $H_{xy}$, as illustrated in the Lissajous figure of FIG. 8. Triangular drive, as well as other types of drive, provides satisfactory field cycles for switch operation in the three-quadrant mode being described herein. In this regard, it should be noted that three-quadrant operation could be modified somewhat, so that the change in amplitude of field $H_{xy}$ occurs over a shorter or longer time period than one quadrant. The basic operation is that using a drive field which is continuous but which changes in magnitude when switch current is to be applied for determination of a bubble path, the drive field being used for bubble propagation as well as for switching operations.

Figure 9:
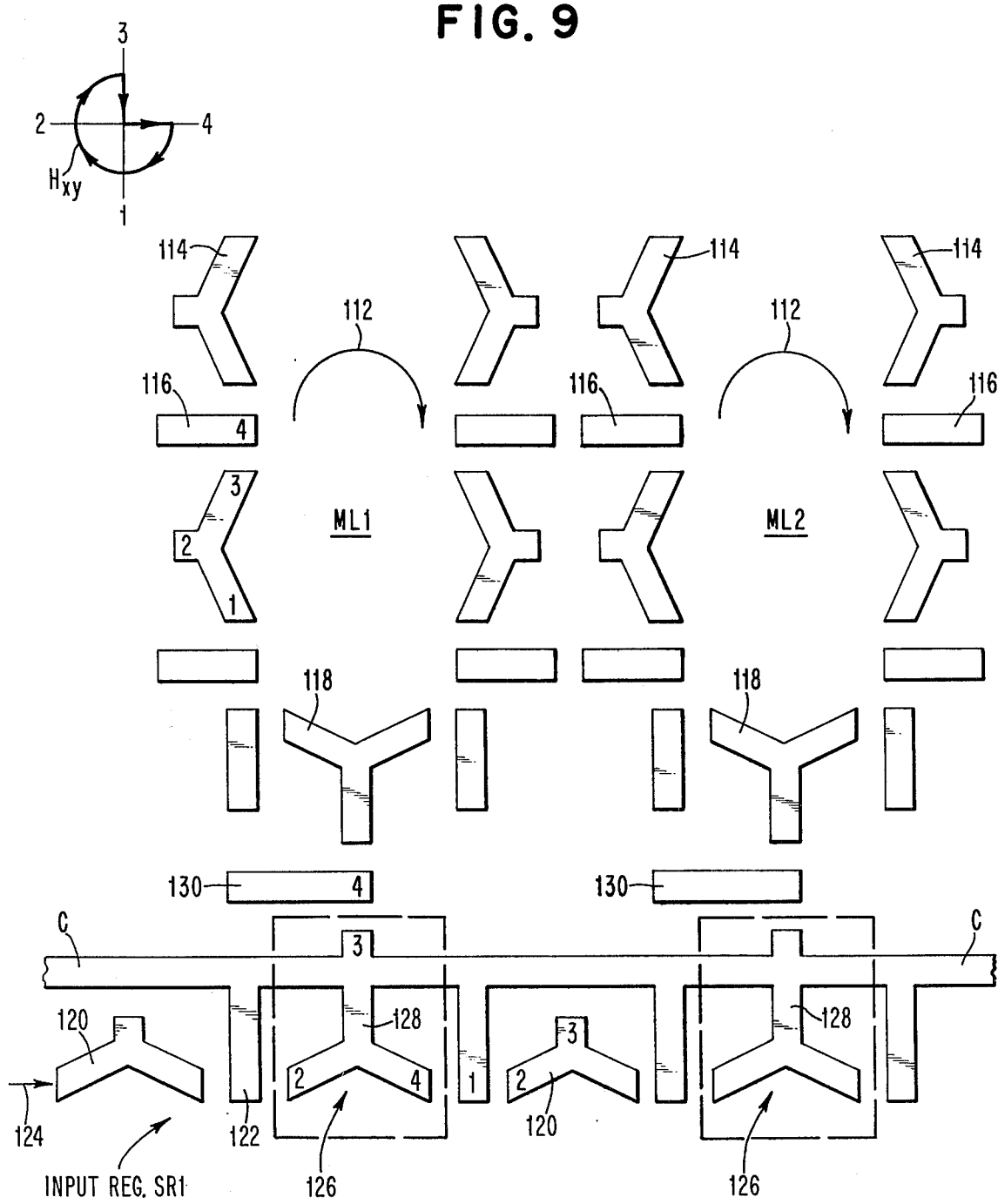
FIG. 9 illustrates a magnetic bubble domain chip using propagate elements and transfer switches which operate with three-quadrant drive fields.
Figure 12:
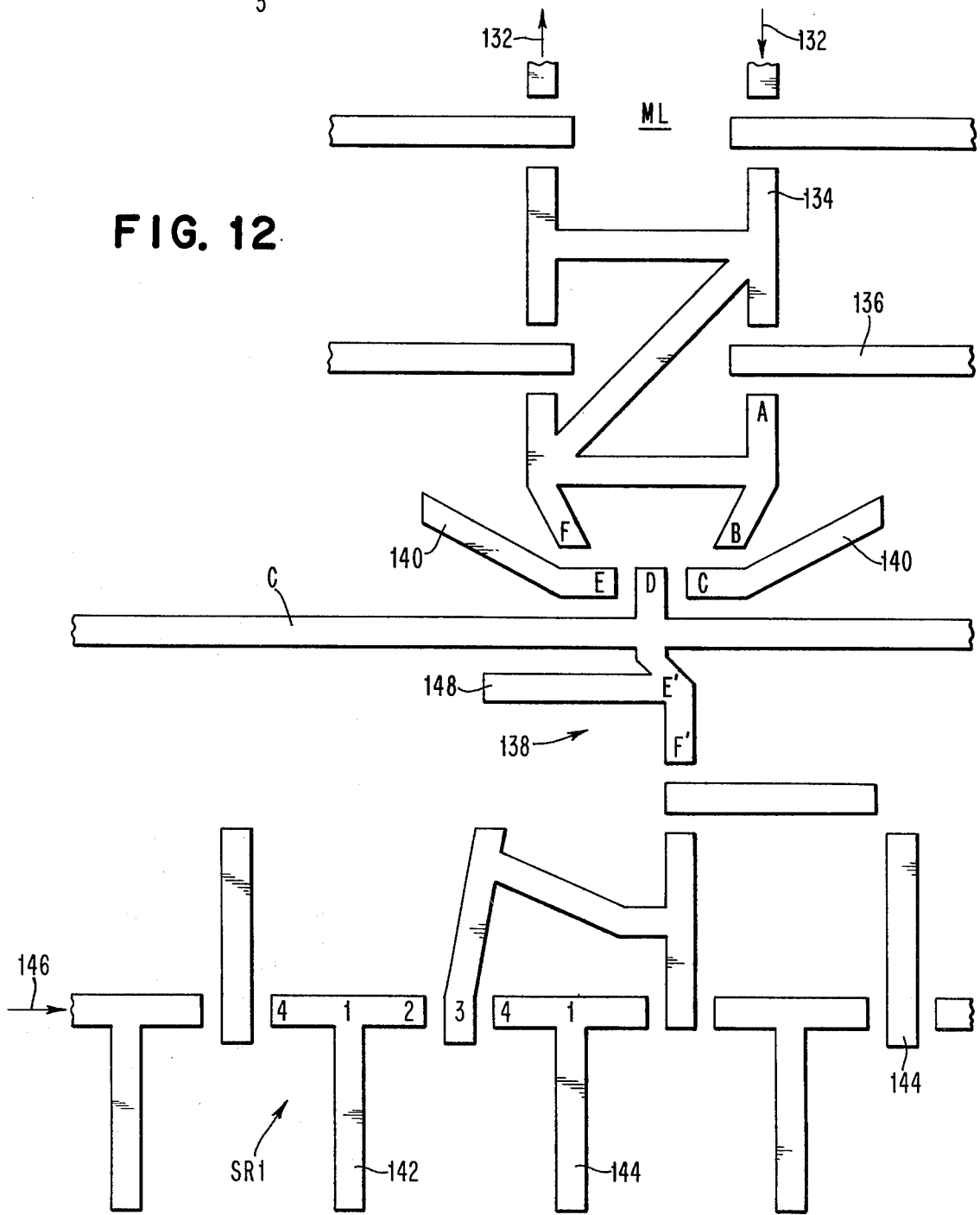
FIGS. 12 and 13 show portions of magnetic bubble domain circuits including transfer switches and propagation elements operating under the field cycle shown in FIG. 11.
Figure 13:
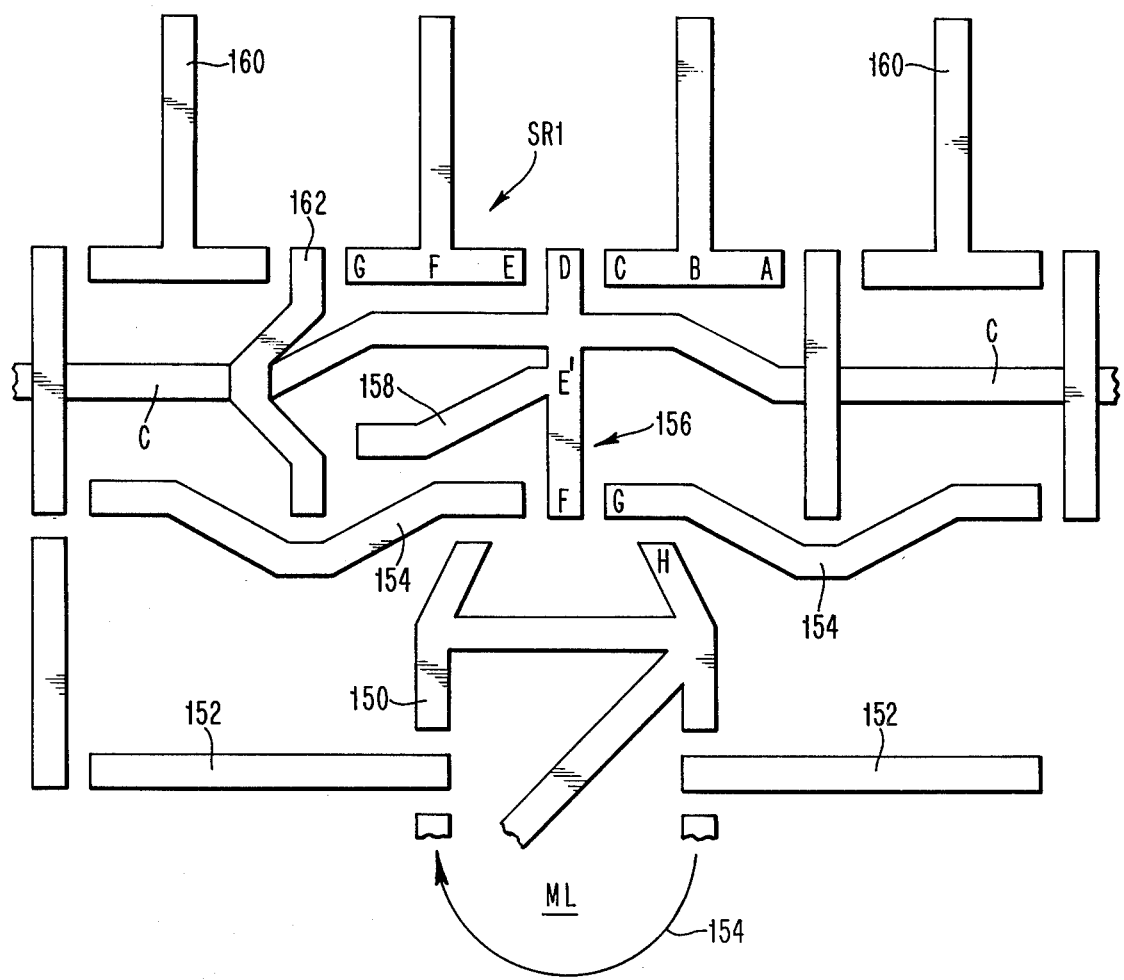

FIGS. 9, 12 and 13 show various switches and propagation elements which can be used with three-quadrant drive field cycles. These propagation elements and switches are merely illustrative and those of skill in the art will be able to easily design other components and geometries which also operate very well with three-quadrant drive cycles.

In more detail, FIG. 9 shows a Y-I bar magnetic circuit for moving magnetic bubble domains. Such a circuit is known in the art, and is described more particularly in copending application Ser. No. 709,358, filed July 28, 1976 now abandoned, and assigned to the present assignee.

In more detail, portions of two minor loops ML1 and ML2 are shown. Under three-quadrant field cycle $H_{xy}$, bubble domains in these minor loops propagate in the direction of arrows 112 along the Y-bars 114 and I-bars 116. Corner Y-bar elements 118 are located at the bottom of each minor loop.

An input shift register SR1 is comprised of Y-bars 120 and I-bars 122. Register SR1 is used to bring domains from an input source to the minor loops along the direction indicated by arrow 124. In order to transfer domains from register SR1 to the minor loops, write transfer switches 126, shown in dashed lines, are provided. These are Y-bar transfer switches of the type shown in FIG. 1B. In this embodiment, they comprise a Y-bar 128 with a conductor C crossing the base leg of the Y-bar. Y-bar 128 can be comprised of any magnetic material, such as NiFe, while the conductor C can be comprised of the same material or another conducting material, such as gold. I-bars 130 are located between the minor loops and the transfer switches 126.

The operation of switch 126 will now be described. A bubble domain will be at pole position 2 on the left-hand arm of Y-bar 128 when field $H_{xy}$ is in direction 2. As field $H_{xy}$ rotates to direction 3, the bubble domain will travel along Y-bar 128 to pole position 3 at the base of this element. Field $H_{xy}$ then goes to zero between phases 3 and 4. If a current $I_S$ of appropriate polarity is applied to conductor C between phases 3 and 4, the bubble domain will move to pole position 4 on I-bar 130 when field $H_{xy}$ is in direction 4. In the absence of current $I_S$ the bubble domain will move to pole position 4 on the right-hand arm of Y-bar 128. Thus, switch 126 is normally-off so that bubble domains are not transferred to the minor loops unless a current $I_S$ is present in conductor C. This is operation of the switch in a drive-to-transfer mode, which is preferable.

Of course, if it is desired to retain the bubble domains in register SR1 rather than transferring them into minor loops, they can be recirculated in this register or annihilated as is well known.

Bubble domains in the minor loops propagate along the Y-bars 114 and I-bars 116 in exactly the same manner as they do when field $H_{xy}$ continually rotates through 360° without a change in amplitude. If desired, a small holding dc field in direction 3 can be applied in addition to field $H_{xy}$, as was mentioned previously. If this is done, switching current $I_S$ will have to be increased by a small amount, since this small holding field will have to be overcome.

Figure 10:
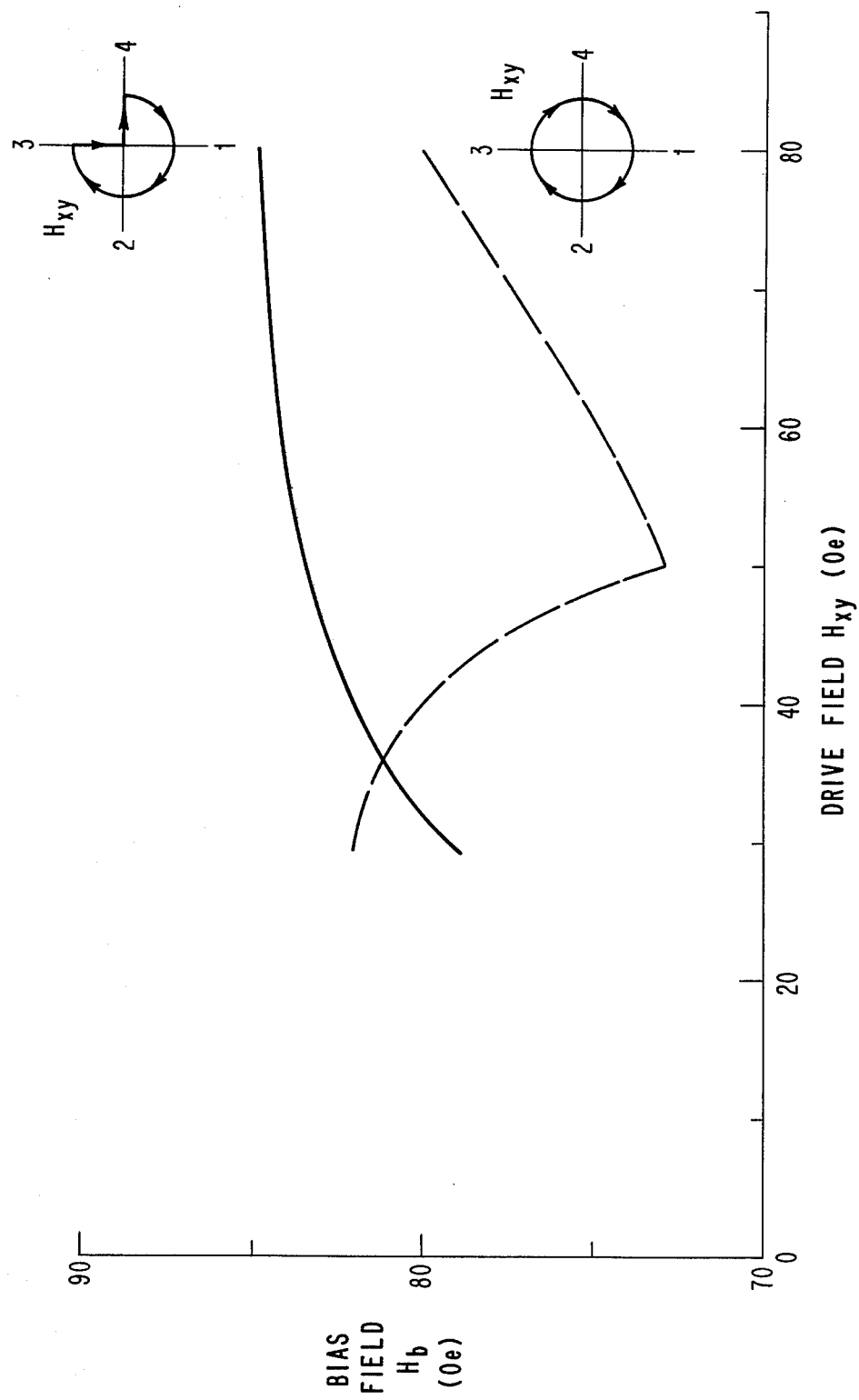
FIG. 10 shows the upper margin plot for the transfer switch in FIG. 9 operating on a conventional 360° rotation drive field and operating with a three-quadrant drive field in accordance with the principles of the present invention.

FIG. 10 is a plot of the upper margin for the Y-bar switch 126 of FIG. 9 for quasistatic operation. The solid curve represents the margin plot for operation using a three-quadrant field cycle, while the dashed line is the margin plot for switch operation using the ordinary full 360° field cycle for drive field $H_{xy}$. As is apparent from this plot, there is a decrease in margin for switch operation when the customary 360° field cycle is used. Thus, the three-quadrant field cycle provides improved switch operation for a SLM switch in that the upper margin is increased. This improvement is caused by the mitigation of magnetization-reversal effects in the NiFe below the conductor.

As is apparent, other components, such as propagating elements, operate in the usual fashion during application of three-quarter field cycles. Since bubble motion elsewhere in the magnetic circuit is not disturbed by the switching operation (because bubble motion is not adversely affected by this three-quadrant cycle), the magnetic circuit can be designed to provide other advantages. For example, a stop-start switch of the type shown in FIG. 9 can be used to control the data flow from a replicate generator with a low current, rather than using a high current in a hairpin loop to generate bubble domains.

Another advantage to the use of a three-quadrant cycle relates to noise pickup in magnetoresistive sensors. Such pickup is common in the absence of a bubble domain since the reorientation of drive field $H_{xy}$ causes Barkhausen noise signals which originate in magnetization reversal in the sensor. When a three-quadrant cycle is used, the sensor can be arranged so that the sense signal is strobed only during the quadrant of field $H_{xy}$ where $H_{xy}$ is minimized. Thus, domains will be sensed substantially in the absence of this type of noise.

Still another advantage derived from use of the three-quadrant cycle is that the switch operation margins are better as indicated in FIG. 10. In more detail, switches often exhibit bubble collapse along the conductor C during switching. However, such collapse is suppressed both during switching and when the switch is not energized for switching, since the field $H_{xy}$ is minimized at the time the bubble domain moves under the conductor along the base of the Y-bar 128.

Of course, the most obvious and basic advantage of the three-quadrant cycle in terms of memory circuit design is that it is a normal cycle for memory operation. That is, bubble motion elsewhere in the magnetic circuit is not disturbed by this field cycle. This is the primary advantage over the start-stop switches shown in the first embodiment, where a change in direction of the magnetic drive field $H_{xy}$ was used. In that embodiment, the propagation circuits and other components in the bubble chip have to be tolerant of the change in field cycle.

Figure 11:
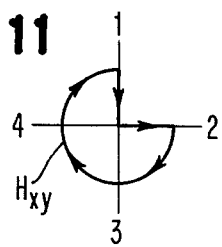
FIG. 11 illustrates a three-quadrant drive field $H_{xy}$ which is used to implement bubble domain transfer in the bubble domain circuits shown in FIGS. 12 and 13.

FIGS. 12 and 13 illustrate switches operating under the three-quadrant field cycle of FIG. 11. This field cycle is also used to move bubble domains along customary T and I bars. As was noted earlier with respect to FIGS. 3A and 3B, the three-quadrant cycle is similar to the field cycle described for operation of the switch of FIG. 3A except that the three-quadrant cycle is used for normal bubble propagation also, and not just for switching bubble paths. Thus, the switch operation to be described hereinafter is essentially the same as that described earlier with respect to FIGS. 3A and 3B.

In more detail, FIG. 12 is a portion of a circuit comprising a minor loop ML along which bubble domains travel clockwise in the direction of arrows 132. This minor loop is typically comprised of T-bars 134 and I-bars 136. A T-bar toggle switch comprises the modified T-bar 138 and the modified I-bars 140. A shift register SR1 is comprised of T-bars 142 and I-bars 144. Register SR1 is used to move bubble domains to the right in the direction of arrow 146, under the field cycle shown in FIG. 11.

Bubble domains can be removed from minor loop ML by the T-bar transfer switch. A bubble domain will travel down the right-hand side of the minor loop from position A to position B to position C, as field $H_{xy}$ moves from phase 1 to phase 4. At phase 4 the bubble is at C while at phase 1 it is at position D on the modified T-bar 138. Position D is the critical position, since at the following field phase 2, the bubble can go to either position E or position E'. A small current in conductor C will tip the bubble into either position E or E'. That is, current of a first sense in conductor C will encourage the bubble to go to E' while a current of the opposite sense will encourage the bubble to go to E. If the bubble goes to E', it will leave the minor loop and will be propagated to register SR1. If the bubble goes to position E, it will be retained in the minor loop.

The lengths of magnetic bars 140 and 148 determine whether the bubbles will normally go to position E or position E' in the absence of a current in conductor C. Thus, if it is desired to retain the bubbles in the minor loop except when a current pulse is applied, the pole associated with position E should be stronger than that associated with position E'. To achieve this, bar 140 is longer than bar 148.

The write-in switch shown in FIG. 13 operates analogously to the readout switch of FIG. 12. Thus, the minor loop will also be designated ML and the input shift register will be designated SR1.

Minor loop ML is comprised of T-bars 150 and I-bars 152. When field $H_{xy}$ (FIG. 11) is applied, bubble domains travel clockwise around the minor loop as indicated by arrow 154. A transfer switch is used to bring domains from input register SR1 to the minor loop. The transfer switch broadly comprises the modified I-bars 154 and the modified T-bar 156. T-bar 156 includes a base portion 158 whose length determines the strength of pole E'. Conductor C crosses T-bar 156. Input register SR1 is comprised of T-bars 160 and I-bars 162.

In operation, domains move along SR1 from position A to positions B, C, D, E, etc. as field $H_{xy}$ reorients. At phase 1, the bubble domain is at position D at the top of T-bar 156. When field $H_{xy}$ moves to position 2, it has the choice of moving to either pole position E or E'. Again, the sense of the current through conductor C (while $H_{xy}$ is decreasing in amplitude between phases 1 and 2) determines which of these two positions will receive the bubble domain when $H_{xy}$ gets to phase 2. If the bubble goes to position E, it will continue propagating in the major loop. If it goes to position E', it will then go to positions F, G, and H and hence into the minor loop as field $H_{xy}$ continues. The length of bar 158 is used to adjust the strength of position E' with respect to that of position E.

While several different structural geometries have been shown to illustrate the disclosed invention, it will be appreciated by those of skill in the art that other geometries can be used as well. For instance, the start-stop field sequence described with respect to the first embodiment can be used with structures such as the asymmetric half-disk (C-bars) as well as with contiguous disk structures comprising curves or triangular shaped propagation elements. In particular, a three-quadrant propagation cycle can be used with these structures for successful propagation of bubble domains and for successful transfer switches which are designed to be compatible with half-disk of C-bar propagation elements.

Thus, the present invention is primarily directed to transfer switches using current controls for determining the path followed by a bubble domain, and more particularly to techniques for providing such switches in which the amount of current required for transfer is minimized. This is achieved by effecting the transfer operation during a time when the in-plane magnetic drive field is diminishing, or has diminished, to a very small amplitude. Additionally, techniques and structures have been provided for achieving this without disrupting the margins of other magnetic components on the chip.

It is within the skill of those working in the art to devise other modifications of the magnetic drive field and/or of the magnetic elements used in order to achieve other advantages, which however are based on the principles of the present invention.

What is claimed is:

1. A bubble domain device for selectively sending bubble domains along one of two propagation paths, comprising:

at least one magnetic element forming a propagation path for bubble domains as a magnetic drive field continuously rotates through a 360° cycle in a constant sense of rotation, an electrical conductor for carrying current for determining which of said two paths will be followed by a bubble domain passing through said device, means for reducing the amplitude of said magnetic drive field for at least a portion of its cycle, means for applying said current in said conductor while said drive field amplitude is reduced in order to effect path selection through said device, and means for applying a small constant magnetic field in a fixed direction while said rotating field is diminishing in amplitude.

2. In a switch for selection of a path along which magnetic bubble domains travel in response to the reorientation of a magnetic field, said switch including at least one magnetic element along which said bubble domains travel as said field reorients and a conductor in which current is passed to assist selection of the path followed by said bubble domains through said switch, the improvement comprising:

means for reducing the amplitude of said magnetic field, and means for passing current through said conductor when said magnetic field amplitude is reduced, where said magnetic field has a cycle which is continuous, in both the presence and absence of said current in said conductor, and rotates in a constant direction through 360°, said continuous field having reduced amplitude during approximately 90° of said 360° rotation, and means for applying a dc holding field in a fixed direction to said switch while the amplitude of said magnetic field is reduced.

3. A magnetic switch for controllably sending bubble domains along one of two propagation paths, comprising:

at least one magnetic element defining said two propagation paths, field means for producing a cycle of magnetic drive fields having different directional orientations for propagating said bubble domains along said at least one magnetic element, means for reducing the amplitude of said magnetic field when it is in a first orientation and for increasing its amplitude when it is in a second orientation, where said first and second orientations are approximately 180° apart, an electrical conductor located near said at least one magnetic element, electrical means for passing current through said conductor when said magnetic field is reduced in amplitude to determine which of said two paths is followed by said bubble domain.

4. The switch of claim 3, where said magnetic element is comprised of a magnetically permeable material.

5. The switch of claim 3, where said conductor and said magnetic element are comprised of the same material.

6. The switch of claim 3, where said bubble domains have a diameter not in excess of two microns.

7. The switch of claim 3, where said conductor crosses a portion of said magnetic element.

8. The switch of claim 3, further including additional magnetic elements along which bubble domains move in response to continual application of cycles of said magnetic field.

9. The switch of claim 8, where said magnetic elements have gaps between them and said bubble domains are less than about two microns in diameter.

10. A method for determining the path to be followed by a bubble domain along magnetic elements in response to the reorientation of a magnetic field substantially in the plane of said magnetic elements comprising the steps of:

applying a cycle of said magnetic field to move said bubble domains along said magnetic elements, reducing the amplitude of said magnetic field during a portion of said cycle of said magnetic field, passing current through a conductor located near at least one of said magnetic elements during a time when said amplitude of said drive field is reduced in order to choose a path along which bubble domains will travel, and increasing the amplitude of said magnetic field, where said magnetic field is reduced in amplitude when it is in a first direction and is increased in amplitude when it is in a different second direction and where said first and second directions are approximately 180° apart.

11. A method for determining the path to be followed by a bubble domain along magnetic elements in response to the reorientation of a magnetic field substantially in the plane of said magnetic elements comprising the steps of:

applying a cycle of said magnetic field to move said bubble domains along said magnetic elements, reducing the amplitude of said magnetic field during a portion of said cycle of said magnetic field, passing current through a conductor located near at least one of said magnetic elements during a time when said amplitude of said drive field is reduced in order to choose a path along which bubble domains will travel, increasing the amplitude of said magnetic field, and applying a dc magnetic field to said magnetic elements when said magnetic drive field is reduced in amplitude.

12. The method of claim 11, where said original amplitude of said magnetic field is substantially restored after said current is passed through said conductor.

13. A method for determining the path to be followed by a bubble domain along magnetic elements in response to the reorientation of a magnetic field substantially in the plane of said magnetic elements comprising the steps of:

applying a cycle of said magnetic field to move said bubble domains along said magnetic elements, reducing the amplitude of said magnetic field during a portion of said cycle of said magnetic field, passing current through a conductor located near at least one of said magnetic elements during a time when said amplitude of said drive field is reduced in order to choose a path along which bubble domains will travel, and increasing the amplitude of said magnetic field wherein said cycle is altered when said path determination occurs, said alteration including the steps of:

stopping said magnetic field when said field is in a first direction and reducing the amplitude of said field when it is in said first direction, applying said field in a second direction substantially opposite to said first direction and reducing the amplitude of said field when it is in said second direction, and applying said field again in said first direction.

14. A method for determining the path to be followed by a bubble domain along magnetic elements in response to the reorientation of a magnetic field substantially in the plane of said magnetic elements comprising the steps of:

applying a cycle of said magnetic field to move said bubble domains along said magnetic elements, reducing the amplitude of said magnetic field during a portion of said cycle of said magnetic field, passing current through a conductor located near at least one of said magnetic elements during a time when said amplitude of said drive field is reduced in order to choose a path along which bubble domains will travel, and increasing the amplitude of said magnetic field, where said magnetic field rotates in a constant sense with a substantially constant amplitude through 360° in said cycle, said rotation being interrupted when path determination is made, wherein said interruption includes the steps of stopping the rotation of said field when it is in a first direction and reducing its amplitude when it is in said first direction, then restarting said field in a different direction and reducing its amplitude when it is in said second direction, and then restarting said 360° rotation of said magnetic field.

15. A magnetic bubble domain chip for operation with a continuous drive field which reorients with a constant sense of reorientation during all cycles of application of said drive field, comprising:
  a magnetic medium in which magnetic bubble domains can be moved along propagation patterns in response to the reorientation of said magnetic drive field,
  propagation patterns forming registers along which said bubble domains move as said drive field reorients,
  field means for producing said magnetic drive field having a component substantially in the plane of said propagation pattern, said drive field being a field which reorients through 360° in each cycle with a constant sense of reorientation,
  means for reducing the amplitude of said magnetic drive field without changing the sense of reorientation of said magnetic drive field,
  magnetic switch means for transferring said bubble domains from a first one of said registers to a second one of said registers in response to an electrical current in a conductor located adjacent to said magnetic switch means, said current being applied when said magnetic drive field is reduced in amplitude, said switch means including means for transferring said bubble domains in response to said constant sense of reorientation of said magnetic drive field and
  means for sensing said bubble domains when said magnetic drive field is reduced in amplitude.

16. The magnetic chip of claim 15, where said magnetic drive field amplitude is reduced for about one-quarter of said 360° reorientation.

17. The magnetic chip of claim 15, where the amplitude of said magnetic drive field is reduced for a portion of said 360° cycle of reorientation.

18. The magnetic chip of claim 15, where said propagation patterns and said magnetic switch means are comprised of patterned magnetic elements.

19. The magnetic chip of claim 15, where said conductor, said propagation patterns, and said magnetic switch means are comprised of the same material.

20. The magnetic chip of claim 15, where said bubble domains have a diameter not in excess of 2 microns.

21. The magnetic chip of claim 15, where said conductor crosses a portion of said magnetic switch means.

22. The magnetic chip of claim 15, where said propagation patterns and said magnetic switch means are comprised of magnetic elements having gaps between them, and said bubble domains are less than about 2 microns in diameter.

23. The magnetic chip of claim 15, further including means for applying a dc holding magnetic field when said magnetic drive field amplitude is reduced.

* * * * *